United States Patent
Saly

(10) Patent No.: US 9,802,828 B2
(45) Date of Patent: Oct. 31, 2017

(54) PRECURSORS SUITABLE FOR HIGH TEMPERATURE ATOMIC LAYER DEPOSITION OF SILICON-CONTAINING FILMS

(71) Applicant: Applied Materials, Inc., Santa Clara, CA (US)

(72) Inventor: Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

(21) Appl. No.: 14/873,866

(22) Filed: Oct. 2, 2015

(65) Prior Publication Data

US 2016/0099146 A1   Apr. 7, 2016

Related U.S. Application Data

(60) Provisional application No. 62/059,496, filed on Oct. 3, 2014.

(51) Int. Cl.
| | | |
|---|---|---|
| H01L 21/02 | (2006.01) | |
| H01L 21/28 | (2006.01) | |
| C01B 33/12 | (2006.01) | |

(52) U.S. Cl.
CPC .......... *C01B 33/12* (2013.01); *H01L 21/0228* (2013.01); *H01L 21/02164* (2013.01); *H01L 21/02211* (2013.01); *H01L 21/02219* (2013.01); *H01L 21/02274* (2013.01)

(58) Field of Classification Search
CPC ......... H01L 21/02208; H01L 21/02211; H01L 21/02214; H01L 21/02219
See application file for complete search history.

(56) References Cited

U.S. PATENT DOCUMENTS

| | | | |
|---|---|---|---|
| 2007/0185263 A1 | 8/2007 | Sakamoto et al. | |
| 2014/0227871 A1 | 8/2014 | Boussie et al. | |
| 2014/0356549 A1* | 12/2014 | Varadarajan | .......... C23C 16/325 427/568 |

* cited by examiner

*Primary Examiner* — Seahvosh Nikmanesh
(74) *Attorney, Agent, or Firm* — Servilla Whitney LLC

(57) ABSTRACT

Provided are methods of depositing silicon-containing films utilizing certain precursors at temperatures of 400° C. or higher. Certain methods comprise exposing a substrate surface to a silicon precursor and another precursor to achieve various films. Examples of silicon-containing films which can be deposited include SiN, SiC, $SiO_2$, SiCN, etc.

6 Claims, 5 Drawing Sheets

PRECURSORS SUITABLE FOR HIGH TEMPERATURE ATOMIC LAYER DEPOSITION OF SILICON-CONTAINING FILMS

CROSS-REFERENCE TO RELATED APPLICATION

This application claims the benefit under 35 U.S.C. §119 (e) to U.S. Provisional Application No. 62/059,496, filed Oct. 3, 2014.

TECHNICAL FIELD

The present invention relates generally to methods of depositing thin films. In particular, the invention relates to processes for the deposition of films comprising silicon.

BACKGROUND

Deposition of thin films on a substrate surface is a ubiquitous process in a variety of industries including semiconductor processing, diffusion barrier coatings and dielectrics for magnetic read/write heads. In the semiconductor industry, in particular, miniaturization benefits from atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited. Another method for deposition of films is chemical vapor deposition, in which two or more reagents are co-flowed to deposit a film over a substrate.

Silicon is a very common component in semiconductor processing. With the continuation of device miniaturization and increase in the complexity of device architecture, many challenges present to deposit highly conformal films over these structures. For example, 3D NAND memory manufacturing will generally call for highly conformal silicon dioxide and silicon nitride inside of holes that have very high aspect ratios. Generally, such films target a similar quality to those deposited via high temperature processes (i.e., greater than 400, 500 or 600° C.). Thin films of this quality which hit high conformality targets are generally deposited by high temperature ALD. However, there are few silicon ALD precursors that can withstand temperatures of greater than 400° C. without self-decomposition. Accordingly, there are new chemistries and methodologies for the deposition of silicon-containing films are sought which addresses one or more of the problems described above.

SUMMARY

One aspect of the invention pertains to a method of depositing a film comprising silicon. The method comprises contacting a substrate surface with a first precursor having a structure represented by (I):

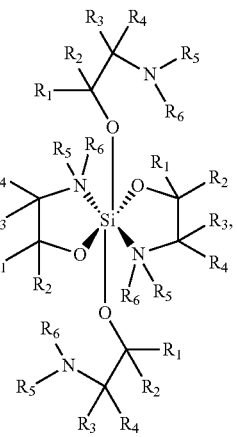

wherein $R_{1-6}$ are each independently H or $C_{1-4}$ alkyl. The method also comprises contacting the substrate surface with at least one oxygen, nitrogen and/or carbon precursor to deposit a film comprising silicon, wherein the substrate surface has a temperature of about 400° C. or greater.

Another aspect of the invention also pertains to a method of depositing a film comprising silicon. The method comprises contacting a substrate surface with a first precursor having a structure represented by (II):

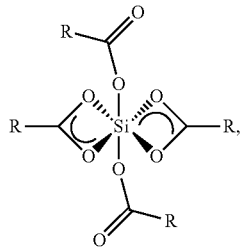

wherein each R is independently $C_{1-6}$ linear or $C_{1-5}$ branched alkyl, $C_{1-6}$ linear or $C_{1-5}$ branched alkenyl, $C_{1-6}$ linear or $C_{1-5}$ branched fluorinated alkyl or amino group. The method also comprises contacting the substrate surface with at least one oxygen, nitrogen and/or carbon precursor to deposit a film comprising silicon, wherein the substrate surface has a temperature of about 400° C. or greater.

Another aspect of the invention also pertains to a method of depositing a film comprising silicon. The method comprises contacting a substrate surface with a first precursor having the formula $R_nSiX_{4-n}$, wherein each X is independently a halide, azide, amino, hydrazide, cyanide or isocyanade group, each R is independently linear $C_{1-6}$ alkyl or branched $C_{1-4}$ alkyl, and n is at least 2. The method also comprises contacting the substrate surface with at least one oxygen, nitrogen and/or carbon precursor to deposit a film comprising silicon, wherein the substrate surface has a temperature of about 400° C. or greater.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
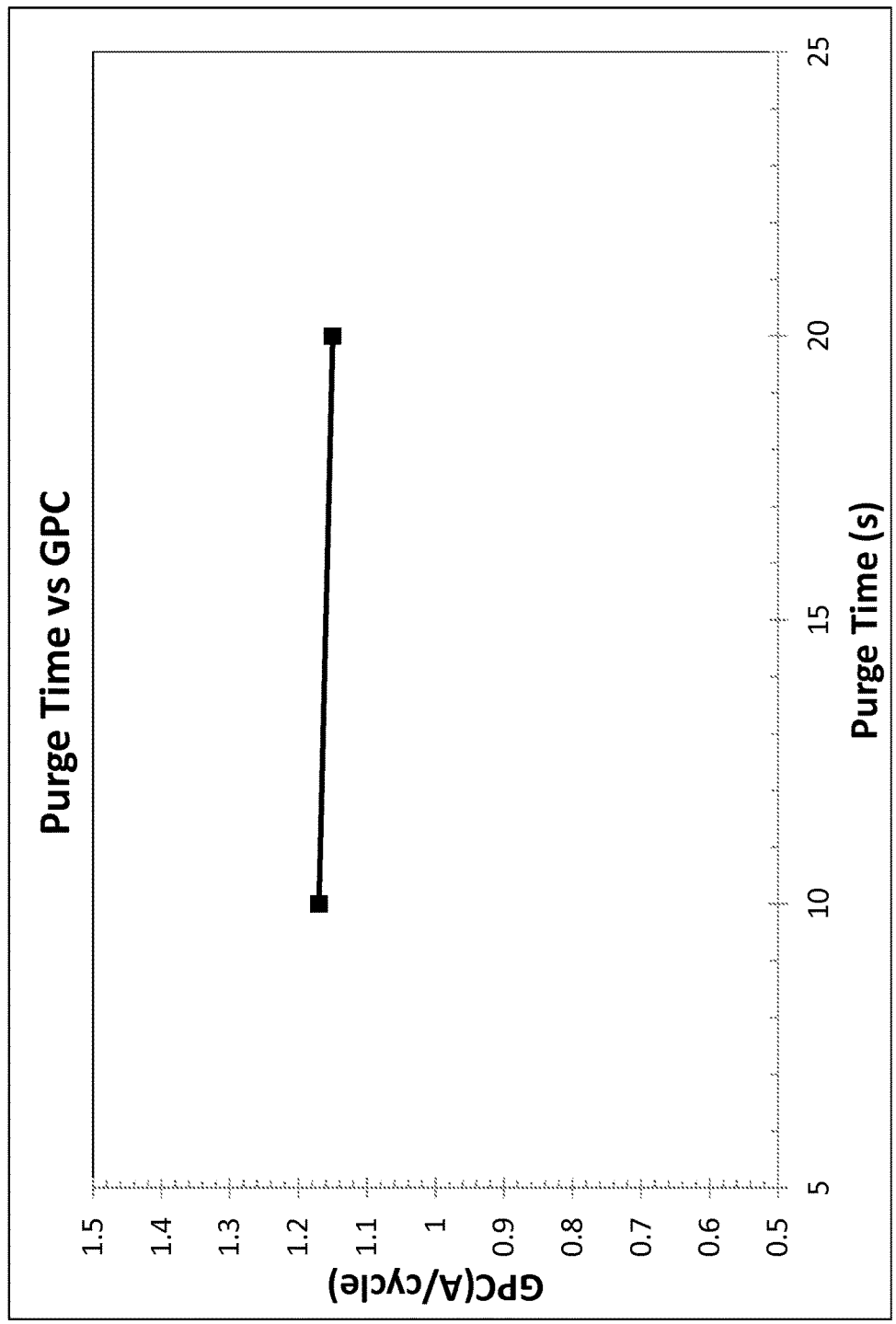
FIG. 1 shows a graph of film growth versus purge time of a film deposited using to method in accordance with one or more embodiments of the invention.

Before describing several exemplary embodiments of the invention, it is to be understood that the invention is not limited to the details of construction or processes set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Silicon-containing films can advantageously be deposited at high temperatures (i.e. 400° C. or greater) using certain silicon precursors. These precursors are highly thermally stable. Examples of suitable silicon-containing films that can be deposited included, but are not limited to, $SiO_2$, SiN, SiCN, SiCON and other similar films. The deposited films also have the advantage of being of high quality and very conformal, making them suitable for use in very small features, including 3D features, such as 3D NAND (Negated AND). Because of the new integration schemes realized with 3D NAND over traditional 2D NAND, film conformality over high aspect ratio structures are becoming more demanded. Films need to be of the highest quality in terms of wet etch and electrical properties. In order to achieve these features, the ALD of Si materials can be deposited at high temperatures. Generally, however, known methods to achieve high quality silicon-containing films (with good electrical properties) utilize precursors that cannot withstand the high temperatures. The methods described herein allow for deposition at higher temperatures, yet still result in films with good electrical properties. Furthermore, because of the stability at high temperature of the precursors in the methods described herein result in highly conformal films. The films deposited by these methods are suitable for structures with high aspect ratios. For example, 3D NAND have high aspect ratios, which warrant films that can coat with good conformality, while still having good electrical properties.

Precursors

In one or more embodiments, precursors suitable for the processes described herein follow general formula $R_nSiX_{4-n}$; wherein each X is independently a halide, azide, amino, hydrazide, cyanide or isocyanade group, each R is independently linear $C_{1-6}$ alkyl or branched $C_{1-4}$ alkyl, and n is at least 2. In some embodiments, n is 2, 3, or 4. In embodiments where X is amino, the amines may be cyclic amines with up to 6-membered rings. In other embodiments where X is amino, the amine may be a primary, secondary or tertiary amine with linear $C_{1-6}$ alkyl or branched $C_{1-4}$ alkyl groups.

While not wishing to be bound to any particular theory, it is thought that the added stability of the precursors at high temperatures stems from the direct Si—C bonds, which are very stable. However, due to the stability of such Si—C bonds, there the precursor has a chemical means to link to a surface to achieve deposition. While not wishing to be bound to any particular theory, it is thought that the X groups as defined above are good leaving group, resulting in a precursor that can react well with surface functionality, such as —OH or —NH groups.

In some embodiments, precursors suitable for the processes described herein have a structure represented by formula (I) or (II) below:

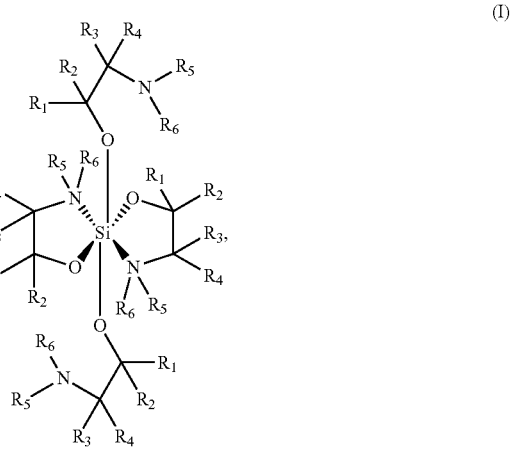

(I)

wherein $R_{1-6}$ are each independently H or $C_{1-4}$ alkyl, or

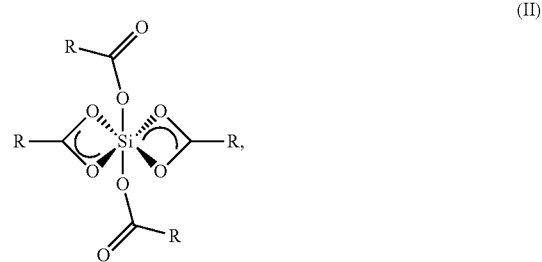

(II)

wherein each R is independently $C_{1-6}$ linear or $C_{1-5}$ branched alkyl, $C_{1-6}$ linear or $C_{1-5}$ branched alkenyl, $C_{1-6}$ linear or $C_{1-5}$ branched fluorinated alkyl or amino group.

The above precursors can be synthesized according to known methods in the art. For example, preparation of $R_{(4-y)}Si(X)_y$, X=$R'_2$N, $N_3$, CN, NCO,

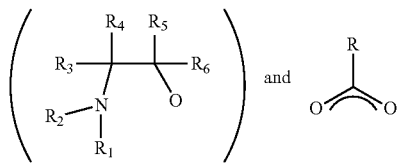

can be carried out as follows:

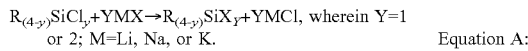

Equation A:

Preparation of $R_{(4-y)}Si(X)_y$, $X=R'_2N$ can be carried out as follows:

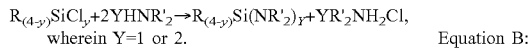

Equation B:

Preparation of bis(isocyanato)dimethylsilane

Dimethyldichorosilane, dimethylamine, anhydrous diethylether and sodium isocyanate, used as starting reagents, are commercially available. Dimethyldichlorosilane (1 mol) is placed in a 3 L three neck round bottom flask equipped with a stir bar, and 1 L of anhydrous diethylether is slowly added to the flask under $N_2$. In a separate 3 neck round bottom flask equipped with a stir bar, 2 mol of sodium isocyanate and 1 L of anhydrous diethylether are added to the flask under $N_2$. Next, the dimethyldichlorosilane/ether mixture is slowly added to the flask containing the sodium isocyanato. After complete addition, the mixture is stirred for 18 h at room temperature. The mixture is filtered through a medium course filter frit to remove the NaCl byproduct which resulted in a clear filtrate. The filtrate is evaporated under reduced vacuum to yield a clear liquid. The clear liquid was distilled for purification. This recipe theoretically yields about 1 mol of bis(isocyanato)dimethylsilane.

Preparation of bis(dimethylamido)dimethylsilane

Reaction proceeds according to Equation B, where R=Me, Y=2. Dimethyldichorosilane, dimethylamine, anhydrous diethylether and sodium isocyanate, used as starting reagents, are commercially available. Dimethyldichlorosilane (1 mol) is placed in a 3 L three neck round bottom flask equipped with a stir bar and 1 L of anhydrous diethylether is slowly added to the flask under $N_2$. Next, dimethylamine is slowly bubbled into the diethylether, resulting in the formation of a white precipitate ($Me_2NH_2Cl$). The addition is stopped when about 5 mols are bubbled through the solution. The mixture is stirred for 18 h at room temperature. At this point, the mixture is filtered through a medium course filter frit to remove the $Me_2NH_2Cl$ byproduct, which resulted in a clear filtrate. The filtrate is evaporated under reduced vacuum to yield a clear liquid. The clear liquid is distilled for purification. This recipe theoretically yields about 1 mol of bis(dimethylamido)dimethylsilane.

Deposition Methods

Another aspect of the invention pertains to methods of depositing silicon-containing films. Any of the compounds described above, as well as additional compounds, may be utilized as silicon precursors.

Accordingly, in one or more embodiments, the method comprises contacting a substrate surface with a first precursor having a structure represented by (I):

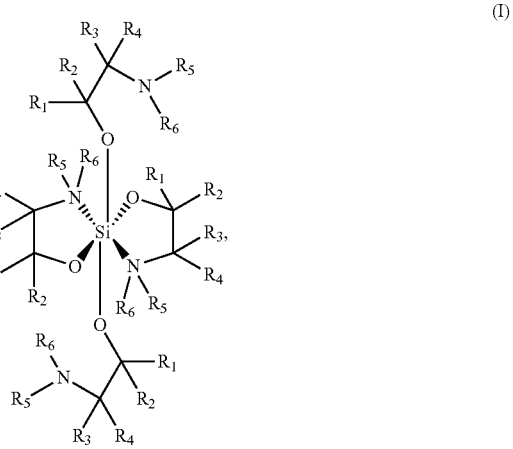

wherein $R_{1-6}$ are each independently H or $C_{1-4}$ alkyl. Next, the substrate surface may be contacted with at least one oxygen, nitrogen and/or carbon precursor to deposit a film comprising silicon, wherein the substrate surface has a temperature of about 400° C. or greater. In some embodiments, $R_{1-4}$ are each independently H, methyl or ethyl and $R_{5-6}$ are each independently methyl or ethyl. In one or more embodiments, the oxygen precursor is selected from the group consisting of $O_2$, $O_3$, $O_2$ plasma and $H_2O$, and the film comprises oxygen. In some embodiments, the nitrogen precursor is selected from the group consisting of $NH_3$, $NH_3$ plasma, a hydrazine or an amine, and the film comprises nitrogen. In one or more embodiments, the carbon precursor is selected from the group consisting of ethylenediamine and acetylene, and the film comprises carbon. In some embodiments, the film is part of a NAND gate.

Another aspect of the invention pertains to another method of depositing a film comprising silicon. In some embodiments, the method comprises contacting a substrate surface with a first precursor having a structure represented by (II):

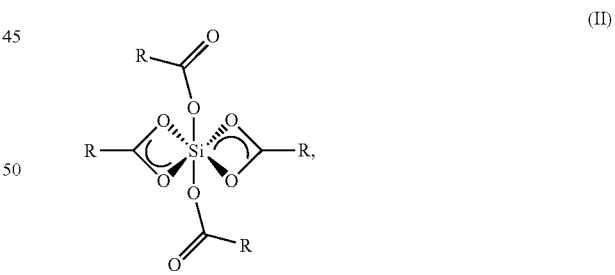

wherein each R is independently $C_{1-6}$ linear or $C_{1-5}$ branched alkyl, $C_{1-6}$ linear or $C_{1-5}$ branched alkenyl, $C_{1-6}$ linear or $C_{1-5}$ branched fluorinated alkyl or amino group. Then, the substrate surface may be contacted with at least one oxygen, nitrogen and/or carbon precursor to deposit a film comprising silicon, wherein the substrate surface has a temperature of about 400° C. or greater. In some embodiments, each R is independently $C_{1-6}$ linear or $C_{1-5}$ branched alkyl or $C_{1-6}$ linear or $C_{1-5}$ branched fluorinated alkyl. In one or more embodiments, the oxygen precursor is selected from the group consisting of $O_2$, $O_3$, $O_2$ plasma and $H_2O$, and the film comprises oxygen. In some embodiments, the nitrogen precursor is selected from the group consisting of $NH_3$, $NH_3$ plasma, a hydrazine or an amine, and the film comprises nitrogen. In one or more embodiments, the carbon precursor is selected from the group consisting of ethylene diamine and acetylene, and the film comprises carbon. In some embodiments, the film is part of a NAND gate.

In another embodiment of this invention the use of molecules having a structure represented by Formulae (I) or (II) for the high temperature deposition of $SiO_2$, SiN, SiCN, SiON, SiCON, etc. These molecules are thought to be stable at relatively high temperatures owing to the direct Si—O bonds which are present in the molecules. Both of these classes of molecules have the potential for eta-1 and eta-2 coordination, which can add stabilization through the chelate effect.

In other embodiments, the method comprises contacting a substrate surface with a first precursor having the formula RnSiX4-n, wherein each X is independently a halide, azide, amino, hydrazide, cyanide or isocyanade group, each R is independently linear C1-6 alkyl or branched C1-4-alkyl, and n is at least 2. Then, the substrate surface may be contacted with at least one oxygen, nitrogen and/or carbon precursor to deposit a film comprising silicon, wherein the substrate surface has a temperature of about 400° C. or greater. In one or more embodiments, at least one X is a cyclic amine with up to 6-membered rings. In some embodiments, at least one X is a primary, secondary or tertiary amine with linear $C_{1-6}$ alkyl or branched $C_{1-4}$ alkyl groups. In one or more embodiments, the oxygen precursor is selected from the group consisting of $O_2$, $O_3$, $O_2$ plasma and $H_2O$, and the film comprises oxygen. In some embodiments, the nitrogen precursor is selected from the group consisting of $NH_3$, $NH_3$ plasma, a hydrazine or an amine, and the film comprises nitrogen. In one or more embodiments, the carbon precursor is selected from the group consisting of ethylenediamine and acetylene, and the film comprises carbon. In some embodiments, the film is part of a NAND gate. Generally, these embodiments of the invention feature the use of highly thermally stable Si ALD precursors which contain a reactive handle (such as cycanide, azide, amino, and hydrido) and a stable Si moiety composed of direct Si—C bonds (such as alklyl or olefins). The precursor's reactive handle (X) should react with the surface and transfer a thermally stable $SiR_n$ moiety which can saturate the surface without self-decomposition. The surface $SiR_n$ groups can then be converted to $SiO_2$ (using $O_2$, $O_3$, $O_2$ plasma, $H_2O$, etc.), SiN (using $NH_3$, $NH_3$ plasma, hydrazines, amines), or even SiCN (using C dopants such as ethylene diamine (EDA), acetylene, amines). This process allows for the deposition of Si dielectrics by ALD at higher temperatures, resulting in high quality and highly conformal films.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. In one or more embodiments, the substrate surface is terminated with —OH, —$NH_2$, or —NH functionality.

Co-reagents/other precursors may be selected depending upon the film ultimately targeted. In one or more embodiments, the co-reagent acts as a precursor for additional atoms. For example, in some embodiments, a film comprising silicon oxide ($SiO_2$) may be deposited using a co-reagent comprising an oxidant. In one or more embodiments, the oxidant comprises gaseous oxygen ($O_2$), ozone ($O_3$) or water ($H_2O$). In other embodiments, films comprising silicon nitride (SiN) may be deposited using a co-reagent comprising a nitrogen precursor. In one or more embodiments, the nitrogen precursor comprises ammonia ($NH_3$), hydrazine ($N_2H_4$) or an amine. In yet other embodiments, a carbon precursor may be used to produce films comprising silicon carbide (SiC). Examples of suitable carbon precursor include carbon tetrachloride, alkanes, ethylene diamine, acetylene, etc. Some co-reagents may act as precursors for more than one atom. In some embodiments, more than one co-reagent is used, wherein each deposits one type of atom. For example, a film comprising silicon, carbon and nitrogen (SiCN) may be deposited using carbon sources (e.g., alkane) as well as nitrogen sources (e.g., ammonia, hydrazine, etc.). If unwanted carbon results in the film, then certain treatments may be used to remove carbon, such as ozone treatments.

In one or more embodiments, the method comprises an atomic layer deposition (ALD) process. As used herein, "atomic layer deposition" refers to a process in which a substrate surface is exposed to alternate or sequential flows of a precursor and/or reagent. That is, the precursor and/or reagents may be flowed and/or exposed to the substrate surface sequentially or substantially sequentially. As used herein "substantially sequentially" refers to where the flows of the precursor and/or reagents do not overlap for a majority of the flow.

Therefore, in one exemplary embodiment, a silicon precursor as described herein may be vaporized into an ALD chamber where the molecule can react with a surface group (OH, $NH_2$, etc), followed by an inert purge. Then, the surface, which may be exposed to a co-reagent such as $O_2$, $H_2O$, $NH_3$, or plasma activated species ($O_2$, $H_2O$, $NH_3$, etc.) which would further react with the silyl species to form a layer of silicon-containing material. Repeating this cycle should afford films with precise thickness control. In an exemplary embodiment, the substrate temperature can be greater than about 400 or 500° C.

Purges may be used after precursors are flowed into the deposition chamber. That is, the substrate and chamber may be exposed to a purge after stopping the flow of the given precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge removes any excess precursor, byproducts and other contaminants within the processing chamber. The purge may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

The reaction conditions for the reaction will be selected based on the properties of the film precursors and substrate surface, and any co-reagents. The deposition may be carried out at atmospheric pressure, but may also be carried out at reduced pressure. The vapor pressure of any co-reagents should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure, although are generally considered to be high temperature (i.e., about 400° C. or higher). The properties of the specific substrate, film precursors, and catalyst may be evaluated using methods known in the art, allowing selection of appropriate temperature and pressure for the reaction.

In one or more embodiments, the deposition is carried out (i.e., substrate temperature) at a temperature of about 400, 450, 500° C. or greater. In some embodiments, the deposition is carried out at a temperature of from about 400, 450, 500° C. to about 700, 750 or 800° C.

Another aspect of the invention pertains to a film deposited by any of the methods described herein.

In some embodiments, one or more layers may be formed during a plasma enhanced atomic layer deposition (PEALD) process, although the relatively high reactivity of the precursors described herein allows for deposition without the assistance of a plasma-based process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be utilized. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to a separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific processes of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or discreetly. For example, a substrate may be rotated throughout the entire process, or the substrate can be rotated by a small amount between exposures to different reactive or purge gases. Rotating the substrate during processing (either continuously or in discreetly) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa. Use of the terms "expose to a substrate surface" and "flow" is intended to encompass both processes.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

Properties of Film

A trimethylsilylpyrrolidine precursor was used in several deposition processes, which has the following structure:

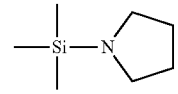

Figure 2:
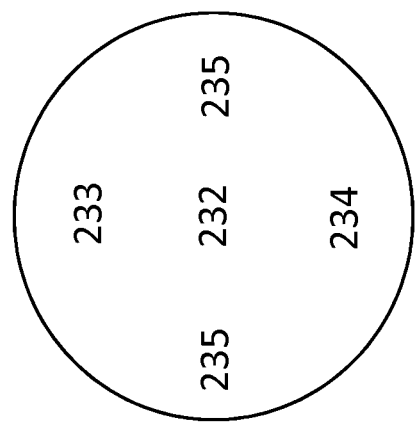
FIG. 2 is an illustration of a 150 mm wafer with a film deposited using to method in accordance with one or more embodiments of the invention.

The pulse train included a 1 second pulse of the precursor, followed by variable purge times, followed by a 3 second pulse of ozone, followed by a variable purge. The deposition was carried out at a temperature of 420° C. The resulting film was $SiO_2$. A graph showing the growth rate (growth per cycle in Angstroms/cycle) versus purge times is shown in FIG. 1. As can be seen from the figure, 10 seconds appears to be an adequate time for purge separation. FIG. 2 represents the thickness over the substrate as deposited with the thickness given at various positions in mm. The substrate was a 150 mm silicon wafer. As can be seen from the figure, the thickness of the deposited film was very uniform, varying by only 3 mm.

Figure 3:
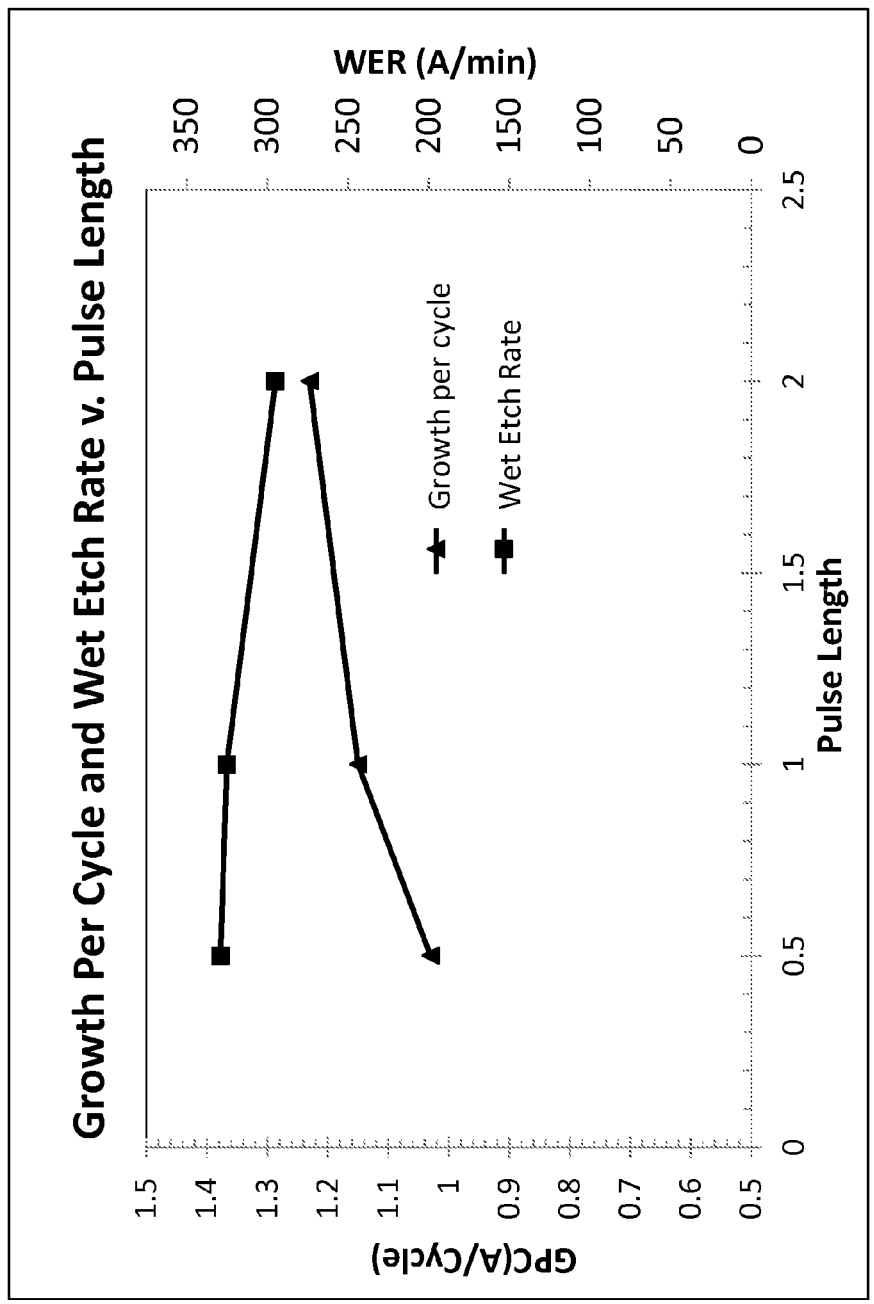
FIG. 3 shows a graph of film growth and wet etch rate versus purge time of a film deposited using to method in accordance with one or more embodiments of the invention.

The growth per cycle and wet etch rate (WER) were also measured as a function of precursor pulse length. For this process, precursor A was pulsed for variable length, followed by a 20 second purge, followed by 3 second ozone pulse, followed by another 20 second purge at 420° C. For WER, the film was exposed to dilute HF (1:100 $diH_2O$). The results are shown in FIG. 3. As can be seen in the figure, variation of the precursor pulse length resulted in similar saturation behavior.

Example 2

Comparison of Inventive and Comparative Precursors

Figure 4:
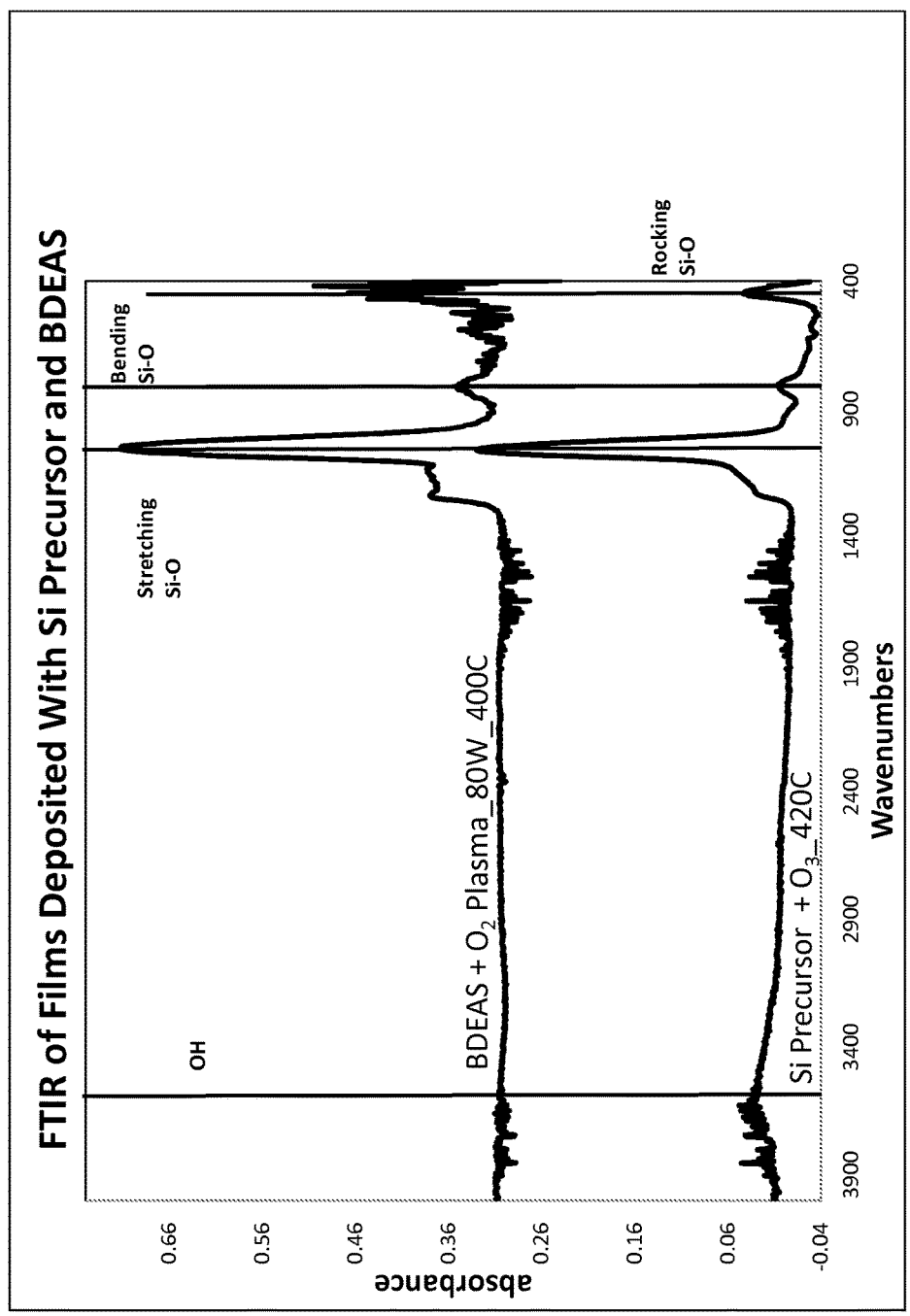
FIG. 4 shows FTIR spectra of a comparative film and a film deposited using to method in accordance with one or more embodiments of the invention.

A film was deposited using the same precursor and ozone as in Example 1 at 420° C. The precursor was pulsed for 2 seconds, followed by ozone pulse for 3 seconds, followed by a 20 second purge. A second film was deposited using bis(diethylamino) silane (BDEAS), a known precursor with $O_2$ plasma at 400° C. BDEAS is not stable at temperatures above 400° C. BDEAS was pulsed 2 seconds, followed by a 5 second pulse of oxygen plasma. The power of the plasma was 100 W. FTIR data was obtained for both films, and shown in FIG. 4. As can be seen from the figure, the films have similar qualities, although there is some OH in the inventive film. This shows that clean $SiO_2$ with properties of known methods, but at higher temperatures.

Example 3

Conformality

Figure 5:
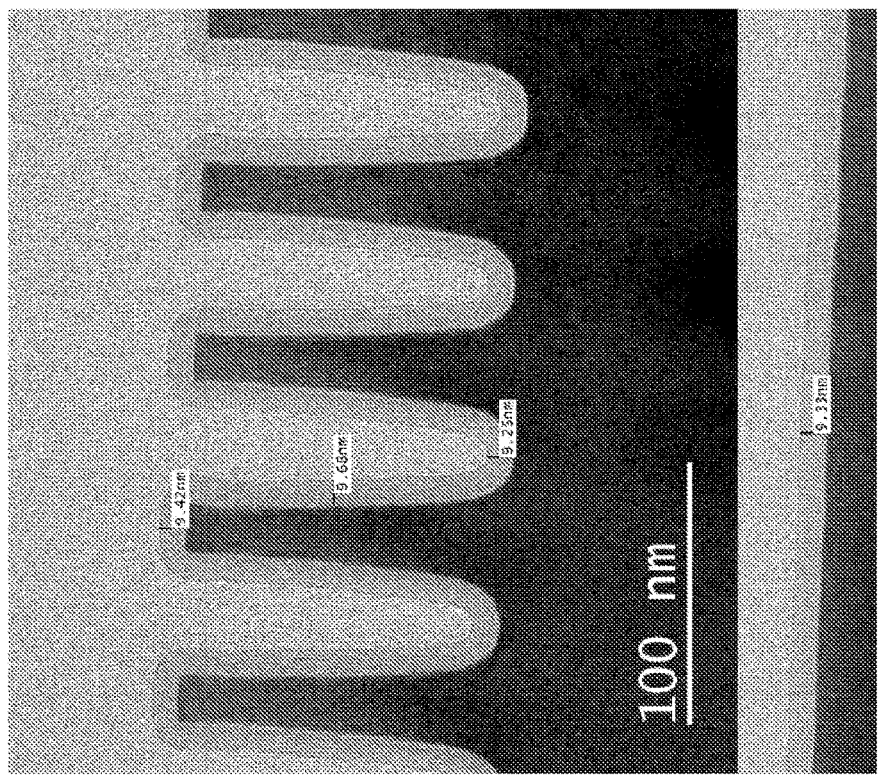
FIG. 5 shows a TEM image of a film deposited using to method in accordance with one or more embodiments of the invention.

The same precursor in Example 1 was used to deposit a film. The silicon precursor was pulsed for 0.8 seconds, followed by a 10 second purge, followed by a 3.0 second pulse of ozone, followed by a 10 second purge at 420° C. Transmission electron microscope (TEM) images were taken of the resulting film and shown in FIG. 5. As shown in the figures, the films are highly conformal, with little variation in film thickness. The measured step coverage is as follows: top/side: 97.3%, bottom/top: 97.8%, field/top: 99.3%, and bottom/field: 98.9%. Values of 95% or higher are generally considered very good. As such, the resulting step coverage for the deposited film is excellent.

What is claimed is:
1. A method of depositing a film comprising silicon, the method comprising:

a. contacting a substrate surface with a first precursor having a structure represented by (I):

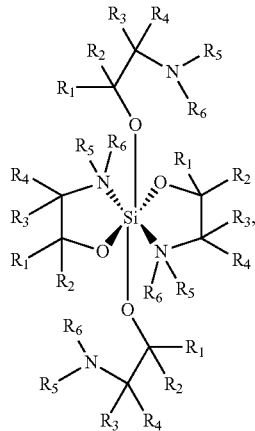

(I)

wherein $R_{1-6}$ are each independently H or $C_{1-4}$ alkyl; and b. contacting the substrate surface with at least one oxygen, nitrogen and/or carbon precursor to deposit a film comprising silicon, wherein the substrate surface has a temperature of about 400° C. or greater.

2. The method of claim 1, wherein $R_{1-4}$ are each independently H, methyl or ethyl and $R_{5-6}$ are each independently methyl or ethyl.

3. The method of claim 1, wherein the oxygen precursor is selected from the group consisting of $O_2$, $O_3$, $O_2$ plasma and $H_2O$, and the film comprises oxygen.

4. The method of claim 1, wherein the nitrogen precursor is selected from the group consisting of $NH_3$, $NH_3$ plasma, a hydrazine or an amine, and the film comprises nitrogen.

5. The method of claim 1, wherein the carbon precursor is selected from the group consisting of ethylene diamine and acetylene, and the film comprises carbon.

6. The method of claim 1, wherein the film is part of a NAND gate.

* * * * *